(12) United States Patent
Gatto

(10) Patent No.: US 11,430,883 B2
(45) Date of Patent: Aug. 30, 2022

(54) SEMICONDUCTOR DEVICE INCLUDING INSULATION FILM WITH PLURALITY OF OPENING PORTIONS AND MANUFACTURING METHOD FOR SEMICONDUCTOR DEVICE

(71) Applicant: Mitsubishi Electric Corporation, Tokyo (JP)

(72) Inventor: Ayanori Gatto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/702,404

(22) Filed: Dec. 3, 2019

(65) Prior Publication Data

US 2020/0295178 A1    Sep. 17, 2020

(30) Foreign Application Priority Data

Mar. 12, 2019    (JP) .............................. JP2019-044386

(51) Int. Cl.
*H01L 29/78*    (2006.01)
*H01L 29/66*    (2006.01)

(52) U.S. Cl.
CPC .... *H01L 29/7811* (2013.01); *H01L 29/66712* (2013.01)

(58) Field of Classification Search
CPC ............... H01L 29/0615–0634; H01L 29/7811
See application file for complete search history.

(56) References Cited

U.S. PATENT DOCUMENTS

| | | | |
|---|---|---|---|
| 8,507,352 B2* | 8/2013 | Koyama | H01L 27/0664 438/328 |
| 8,686,469 B2* | 4/2014 | Nakamura | H01L 23/3171 257/143 |
| 9,041,051 B2* | 5/2015 | Chen | H01L 29/0696 257/139 |
| 2011/0233714 A1* | 9/2011 | Lu | H01L 29/1095 257/493 |
| 2013/0153954 A1 | 6/2013 | Takahashi | |
| 2015/0295048 A1* | 10/2015 | Hiyoshi | H01L 29/36 257/77 |

FOREIGN PATENT DOCUMENTS

| | | |
|---|---|---|
| JP | 2000150859 A | 5/2000 |
| JP | 2013125928 A | 6/2013 |

* cited by examiner

*Primary Examiner* — Stephen M Bradley
(74) *Attorney, Agent, or Firm* — Studebaker & Brackett PC

(57) ABSTRACT

An insulation film includes a first opening portion in at least one of a cell region and a termination region, and a second opening portion in an interface region. The second opening portion has an opening ratio lower than an opening ratio of the first opening portion. The semiconductor device includes a first impurity layer of a second conductivity type, and a second impurity layer of the second conductivity type. The first impurity layer is disposed on a surface of a semiconductor substrate below the first opening portion. The second impurity layer has impurity concentration lower than impurity concentration of the first impurity layer, and is disposed on the surface of the semiconductor substrate below the second opening portion.

10 Claims, 26 Drawing Sheets

F I G. 1 7
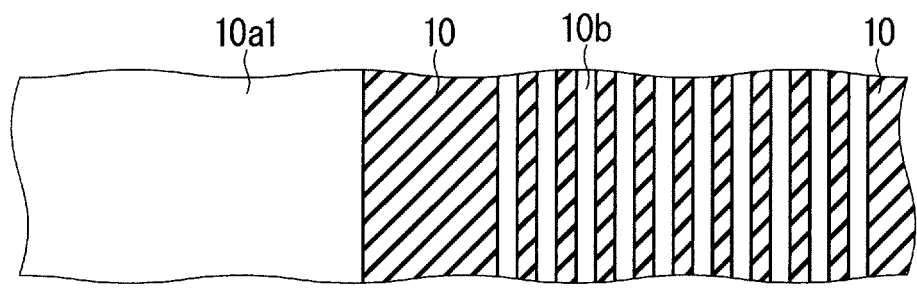

SEMICONDUCTOR DEVICE INCLUDING INSULATION FILM WITH PLURALITY OF OPENING PORTIONS AND MANUFACTURING METHOD FOR SEMICONDUCTOR DEVICE

BACKGROUND OF THE INVENTION

Field of the Invention

The present invention relates to a semiconductor device, and a manufacturing method for a semiconductor device.

Description of the Background Art

Regarding a semiconductor device, a configuration including, between a cell region and a termination region, an impurity layer having impurity concentration lower than that of a portion of the cell region on the termination region side has been proposed (for example, Japanese Patent Application Laid-Open No. 2000-150859 and Japanese Patent Application Laid-Open No. 2013-125928). According to such a configuration including the impurity layer, a positive voltage can be less liable to be applied to a portion between an anode and a cathode in the semiconductor device during recovery. Therefore, current concentration, as well as heat generation, caused at the portion of the cell region on the termination region side during recovery can be reduced.

However, when the impurity layer as above is added, there are problems that an additional mask and an additional process are required, and manufacturing costs are increased.

SUMMARY

The present invention has been made in view of the problems as described above, and has an object to provide a technology that can reduce manufacturing costs of a semiconductor device.

The present invention is intended for a semiconductor device. The semiconductor device includes a semiconductor substrate of a first conductivity type, and an insulation film. In the semiconductor substrate, a cell region, an interface region surrounding the cell region, and a termination region surrounding the interface region are defined. The insulation film is disposed on a surface of the semiconductor substrate. The insulation film includes a first opening portion in at least one of the cell region and the termination region, and a second opening portion in the interface region. The second opening portion has an opening ratio lower than an opening ratio of the first opening portion. The semiconductor device further includes a first impurity layer of a second conductivity type, and a second impurity layer of the second conductivity type. The first impurity layer is disposed on the surface of the semiconductor substrate below the first opening portion. The second impurity layer has impurity concentration lower than impurity concentration of the first impurity layer, and is disposed on the surface of the semiconductor substrate below the second opening portion.

Manufacturing costs of the semiconductor device can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 17 is a plan view illustrating a configuration of a first opening portion and second opening portions according to the first embodiment.

DESCRIPTION OF THE PREFERRED EMBODIMENTS

<Related Semiconductor Device>

First, prior to describing a semiconductor device according to embodiments of the present invention, a semiconductor device related thereto (hereinafter referred to as a "related semiconductor device") will be described. In the following, description will be given by taking an example of a configuration in which a first conductivity type is an N type, and a second conductivity type is a P type. However, this is not restrictive, and the first conductivity type may be a P type, and the second conductivity type may be an N type.

Figure 1:
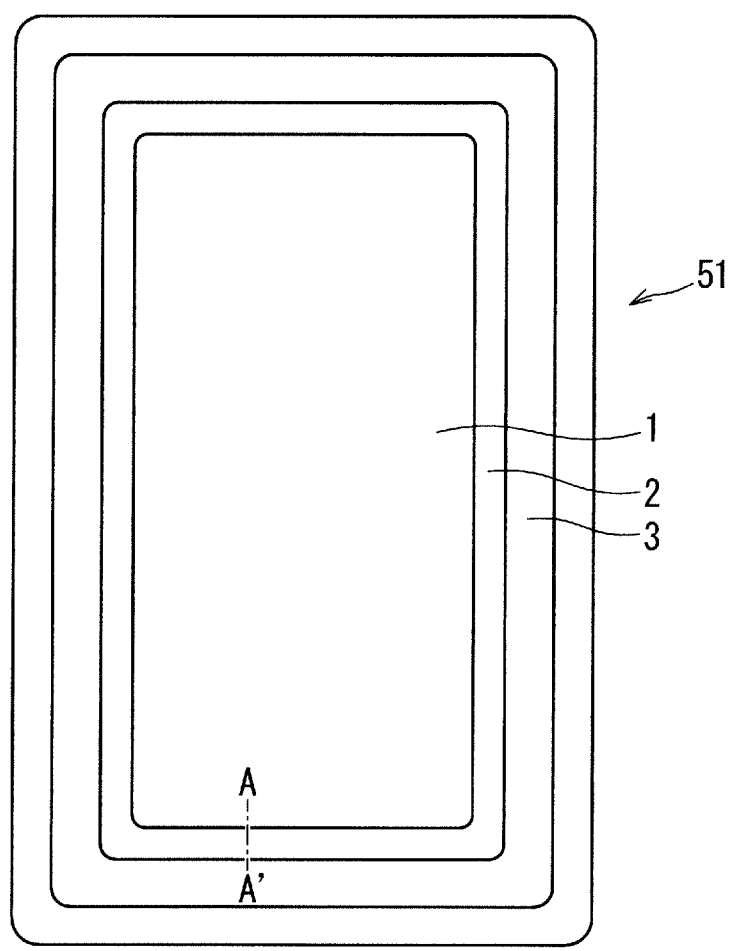
FIG. 1 is a plan view illustrating a configuration of a related semiconductor device.

FIG. 1 is a plan view illustrating a configuration of a related semiconductor device. As illustrated in FIG. 1, the related semiconductor device includes an N-type semiconductor substrate 51. The semiconductor substrate 51 may be made of a general semiconductor wafer, or may be made of an epitaxial growth layer.

In the semiconductor substrate 51, a cell portion 1 being a cell region, an interface portion 2 being an interface region, and a termination portion 3 being a termination region are defined. In plan view, the interface portion 2 is adjacent to and surrounds the cell portion 1, and the termination portion 3 is adjacent to and surrounds the interface portion 2. In the cell portion 1, for example, at least one of a semiconductor switching element with an embedded diode (not shown) and a diode is disposed. In the following, description will be given by taking an example of a configuration in which a semiconductor switching element with an embedded diode is disposed in the cell portion 1. In such a configuration, the cell portion 1 conducts electricity when the semiconductor switching element is turned on, and the termination portion 3 holds a breakdown voltage when the semiconductor switching element is turned off.

Figure 2:
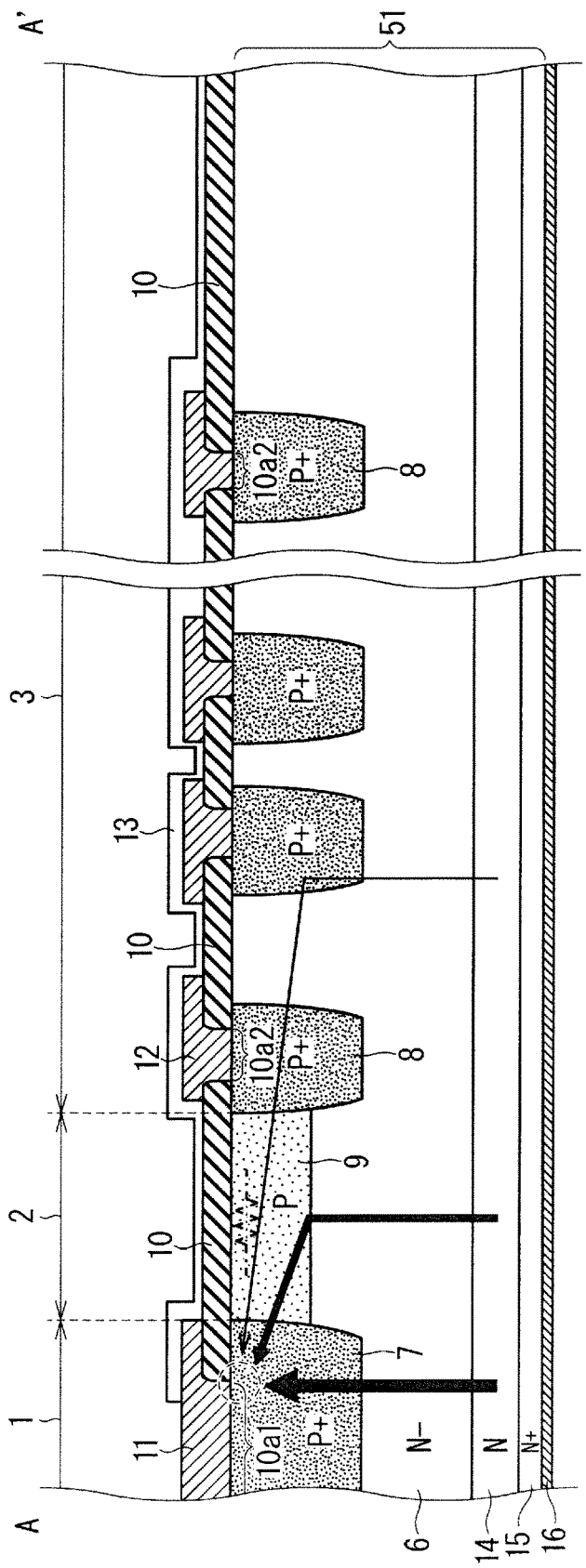
FIG. 2 is a cross-sectional diagram illustrating a configuration of the related semiconductor device.

FIG. 2 is a cross-sectional diagram taken along the line A-A' of FIG. 1. The related semiconductor device includes a drift layer 6, an anode layer 7, guard ring layers 8, a ballast resistance layer 9, an insulation film 10, a front surface electrode 11, a termination conductive film 12, a semi-insulation film 13, a buffer layer 14, an N+ layer 15, and a back surface electrode 16.

In the example of FIG. 2, the drift layer 6 is a portion of the N-type semiconductor substrate 51, except the anode layer 7, the guard ring layers 8, the ballast resistance layer 9, the buffer layer 14, and the N+ layer 15.

The insulation film 10 is an oxide film, for example, and is disposed on a surface of the semiconductor substrate 51. The insulation film 10 includes a first opening portion in at least one of the cell portion 1 and the termination portion 3, and a P+-type first impurity layer is disposed in a surface of the semiconductor substrate 51 below the first opening portion.

In the following, an example in which the first opening portions are disposed in both of the cell portion 1 and the termination portion 3 will be described. Also, an example in which the P+-type first impurity layer is each of the anode layer 7 disposed below a first opening portion 10a1 of the cell portion 1 and the guard ring layers 8 disposed below first opening portions 10a2 of the termination portion 3, and in which a plurality of guard ring layers 8 are disposed below a plurality of first opening portions 10a2 of the termination portion 3 will be described.

The front surface electrode 11 being a conductive film is disposed on the insulation film 10, and is connected to the anode layer 7 through the first opening portion 10a1. The termination conductive film 12 being a conductive film is disposed on the insulation film 10, and is connected to the guard ring layers 8 through the first opening portions 10a2.

The semi-insulation film 13 is disposed on a portion of the front surface electrode 11 on the termination portion 3 side, the termination conductive film 12, and the insulation film 10. For example, the semi-insulation film 13 is a compound film containing a compound of elements of the semiconductor substrate 51 and an insulator, or an organic semiconductor film.

The buffer layer 14 is an N-type impurity layer having impurity concentration higher than that of the drift layer 6 (semiconductor substrate 51), and is disposed on the semiconductor substrate 51 on a back surface side. The N+ layer 15 is an N+-type impurity layer having impurity concentration higher than that of the drift layer 6 and the buffer layer 14, and is disposed further on the back surface side of the semiconductor substrate 51 than the buffer layer 14. The back surface electrode 16 is disposed on a back surface of the N+ layer 15.

Figure 3:
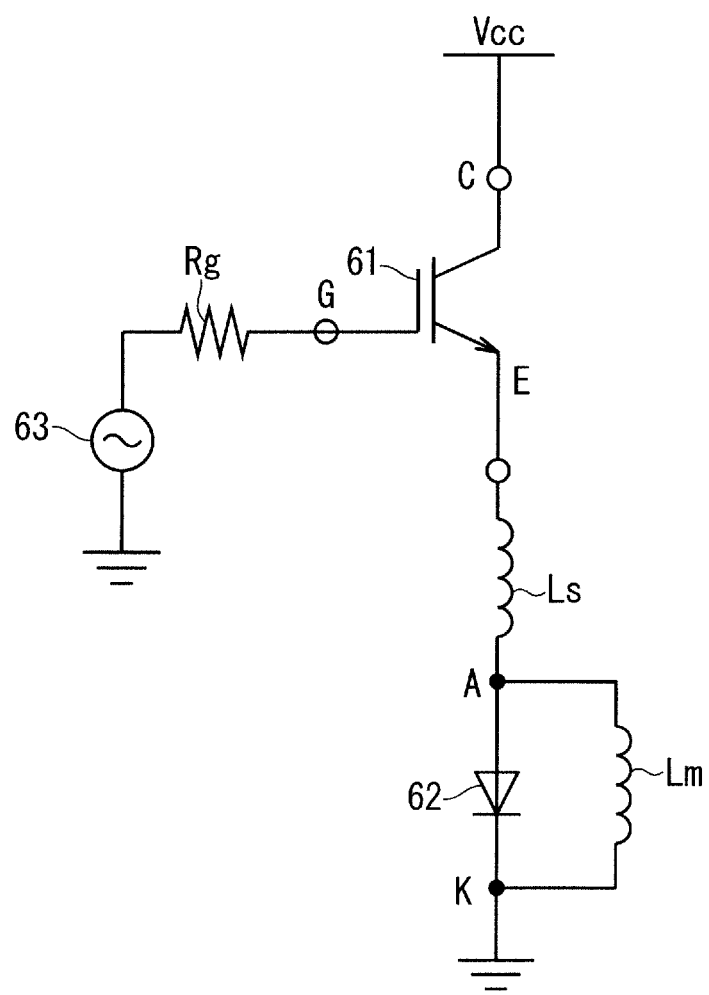
FIG. 3 is a circuit diagram illustrating an equivalent circuit of the related semiconductor device at the time of recovery operation.

FIG. 3 is a circuit diagram illustrating an equivalent circuit of the related semiconductor device at the time of recovery operation. A semiconductor switching element 61 is a semiconductor switching element disposed in the cell portion 1, and a diode 62 is a diode disposed in the cell portion 1. An anode of the diode 62 corresponds to the front surface electrode 11, and a cathode of the diode 62 corresponds to the back surface electrode 16. A circuit parasitic inductance $L_s$ is connected between the diode 62 and the semiconductor switching element 61, and a load inductance $L_m$ is connected in parallel with the diode 62. A gate resistor $R_g$ is connected between the semiconductor switching element 61 and an AC power supply 63. Vcc is 1800 V, for example. Temperature is 423 K, for example. A gate voltage is −15 V to 15 V, for example. The circuit parasitic inductance $L_s$ is 2.47 µH, for example.

Here, when the semiconductor switching element 61 of the cell portion 1 is turned on, carriers are stored in the cell portion 1 and the termination portion 3. Further, when the semiconductor switching element 61 is in a recovery state, a positive voltage is applied between the front surface electrode 11 functioning as an anode and the back surface electrode 16 functioning as a cathode.

Figure 4:
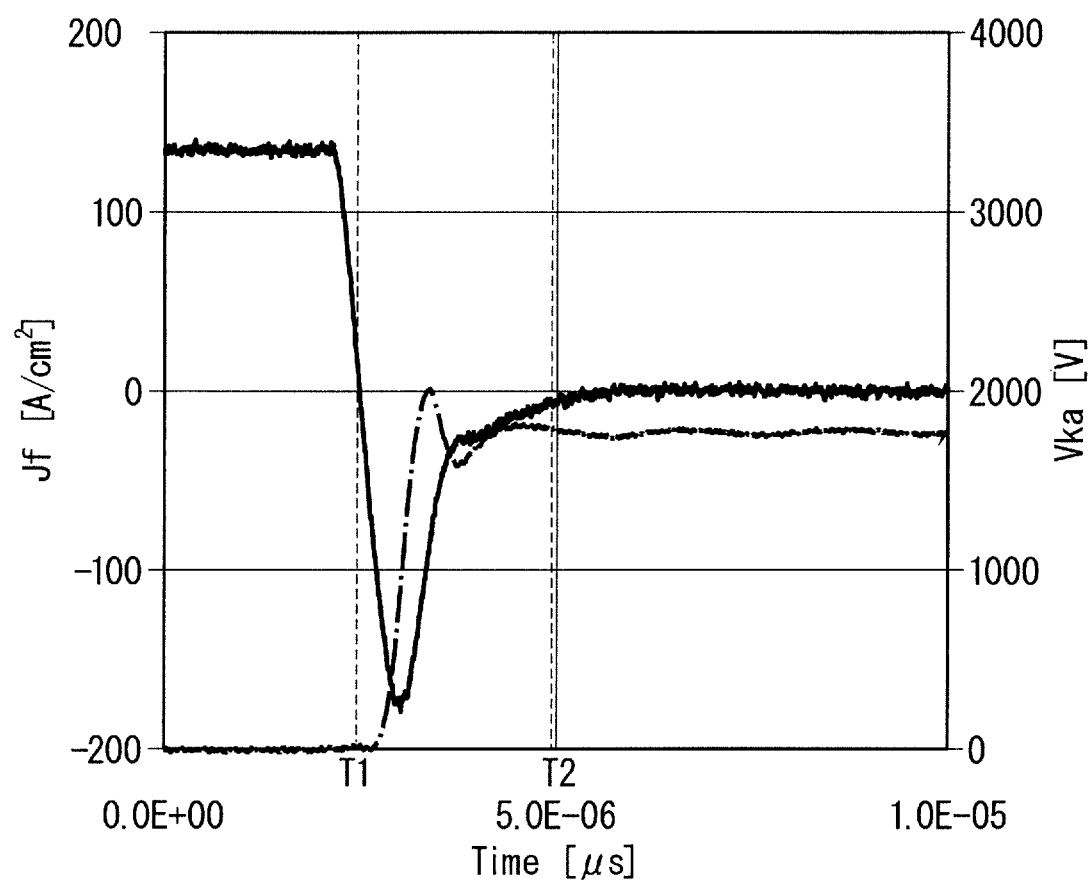
FIG. 4 is a graph showing various waveforms of the related semiconductor device at the time of recovery operation.

FIG. 4 is a graph showing a current waveform (Jf: solid line) and a voltage waveform (Vka: one-dot chain line) of the related semiconductor device at the time of recovery operation. At the time of recovery operation (T1 to T2), the diode 62 is in a state of a high reverse current, a high voltage, and a high dI/dt. As a result, as indicated by the arrows of FIG. 2, internal currents flow toward the anode side. Particularly, internal currents from the termination portion 3 concentrate on a contact portion of the cell portion 1 on the termination side (a portion indicated by the dotted circle of FIG. 2), and thus heat is generated in this portion.

In the related semiconductor device, the ballast resistance layer 9 for reducing this heat generation is disposed. The ballast resistance layer 9 is a P-type impurity layer that has impurity concentration lower than that of the anode layer 7 and the guard ring layers 8 and that is disposed in the interface portion 2. Note that, as illustrated in FIG. 2, in the related semiconductor device, the entire upper surface of the ballast resistance layer 9 is covered by the insulation film 10. Further, the ballast resistance layer 9 is connected to and located between the anode layer 7 and the guard ring layer 8, and a lower end of the ballast resistance layer 9 is located above lower ends of the anode layer 7 and the guard ring layer 8.

The ballast resistance layer 9 configured as described above functions as a resistor (ballast resistor) for internal currents during recovery. Therefore, the internal currents as well as heat generation can be reduced. The lower the concentration of the ballast resistance layer 9, the higher the resistance value of the ballast resistor. As a result, recovery interruption capability of reducing the internal currents can be enhanced without increasing a chip size.

<Manufacturing Method>

Next, a manufacturing method for the related semiconductor device will be described. FIG. 5 to FIG. 15 are each a cross-sectional diagram illustrating a manufacturing method for the related semiconductor device.

Figure 5:
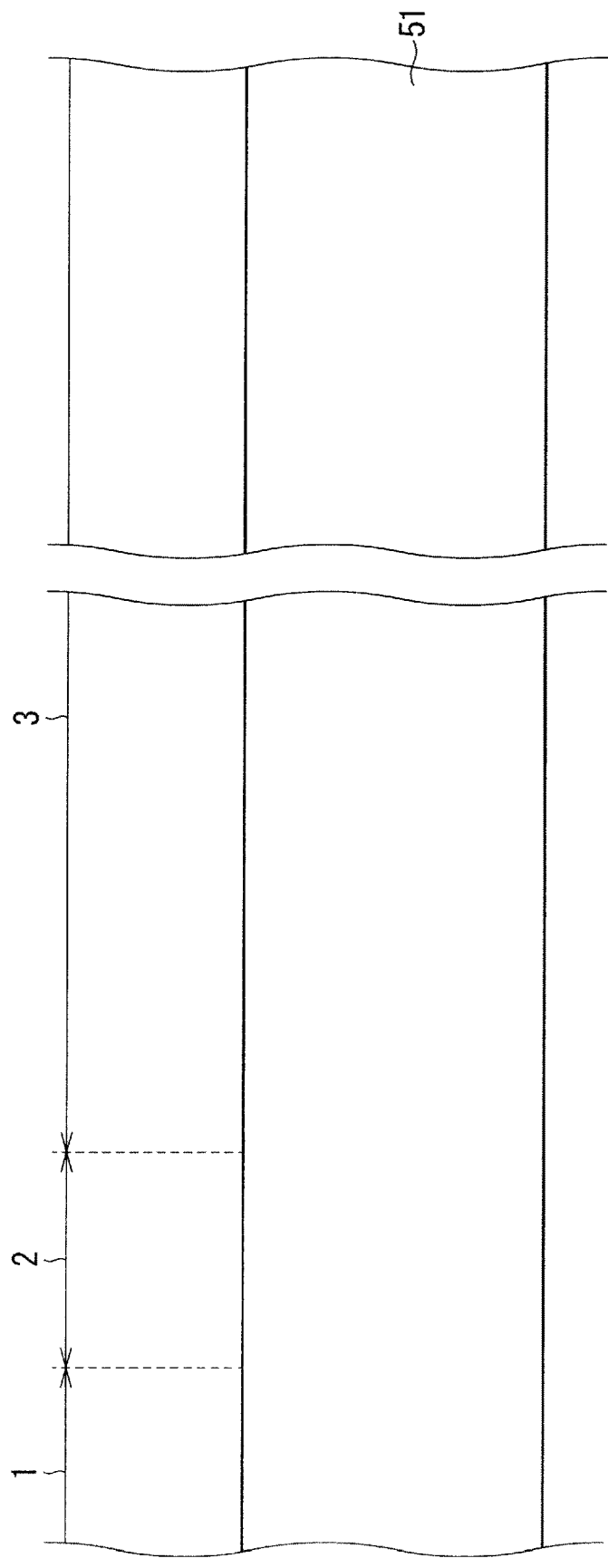
FIG. 5 is a cross-sectional diagram illustrating a manufacturing method for the related semiconductor device.
Figure 6:
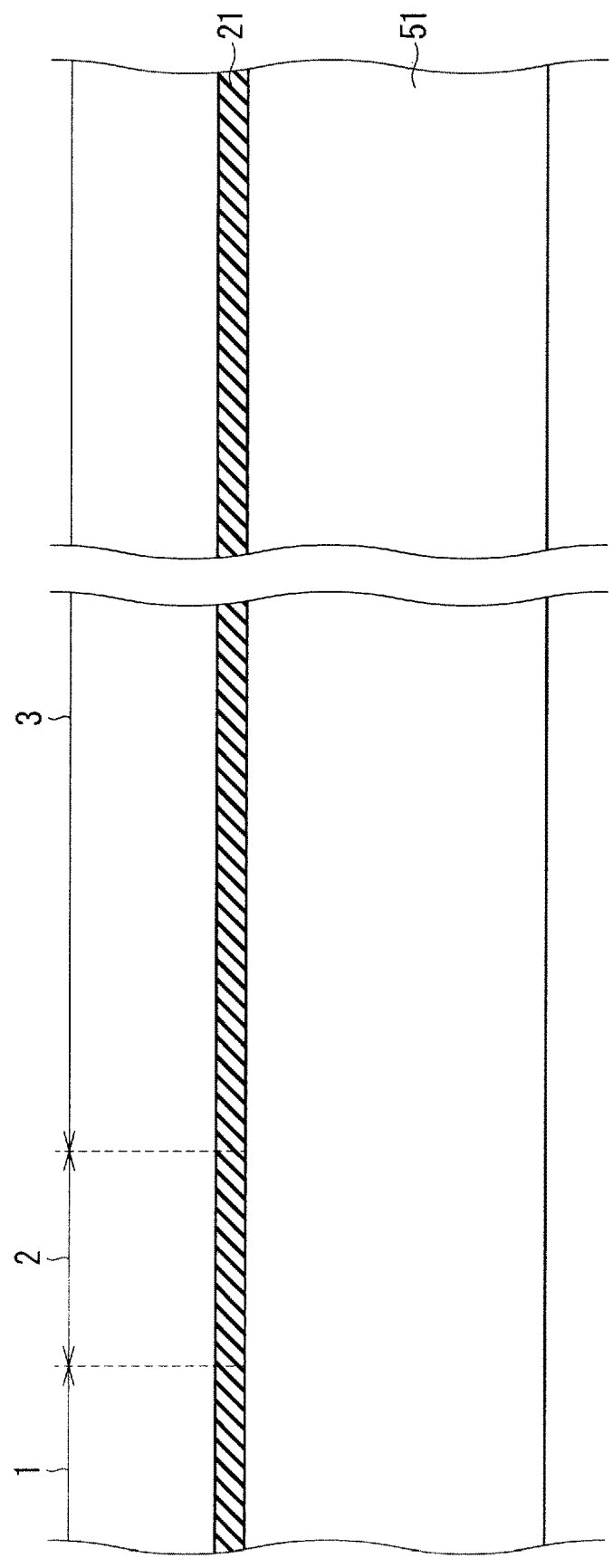
FIG. 6 is a cross-sectional diagram illustrating a manufacturing method for the related semiconductor device.

First, as illustrated in FIG. 5, the semiconductor substrate 51 is prepared. Then, as illustrated in FIG. 6, an insulation film 21 is formed on a surface of the semiconductor substrate 51. As a formation method for the insulation film 21, for example, heating of the semiconductor substrate 51, deposition or coating on the semiconductor substrate 51, or the like is used.

Figure 7:
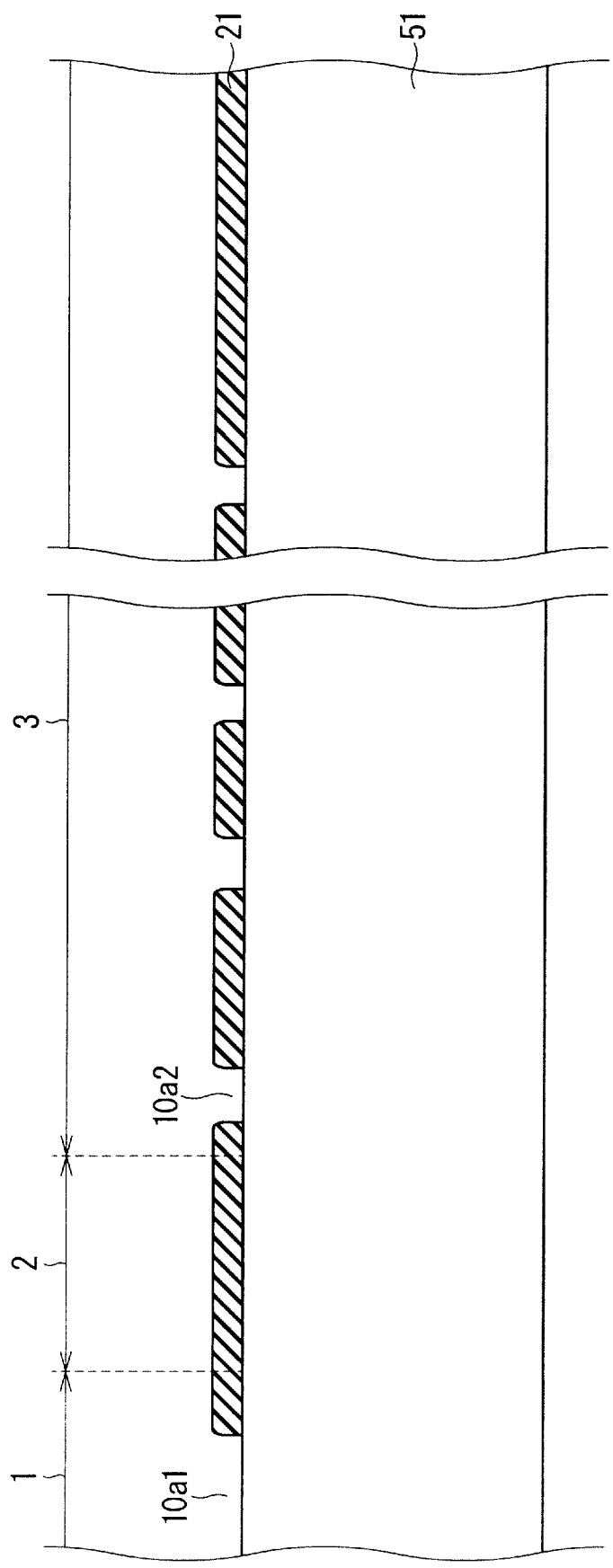
FIG. 7 is a cross-sectional diagram illustrating a manufacturing method for the related semiconductor device.
Figure 8:
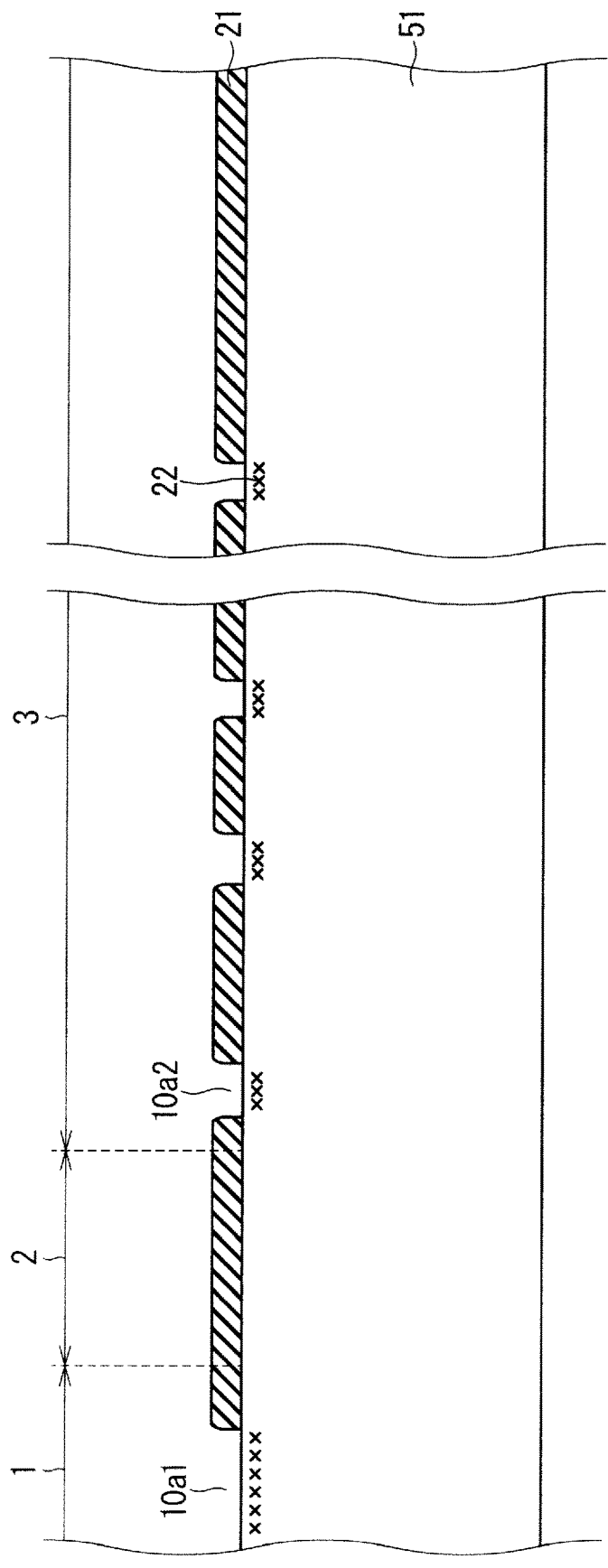
FIG. 8 is a cross-sectional diagram illustrating a manufacturing method for the related semiconductor device.

Then, as illustrated in FIG. 7, photolithography and etching are performed on the insulation film 21, thereby performing patterning. In this manner, the first opening portions 10a1 and 10a2 exposing the semiconductor substrate 51 are formed in the insulation film 21 of the cell portion 1 and the termination portion 3. Then, as illustrated in FIG. 8, P-type impurities 22 are injected into the semiconductor substrate 51 with relatively high concentration, through the first opening portions 10a1 and 10a2.

Figure 9:
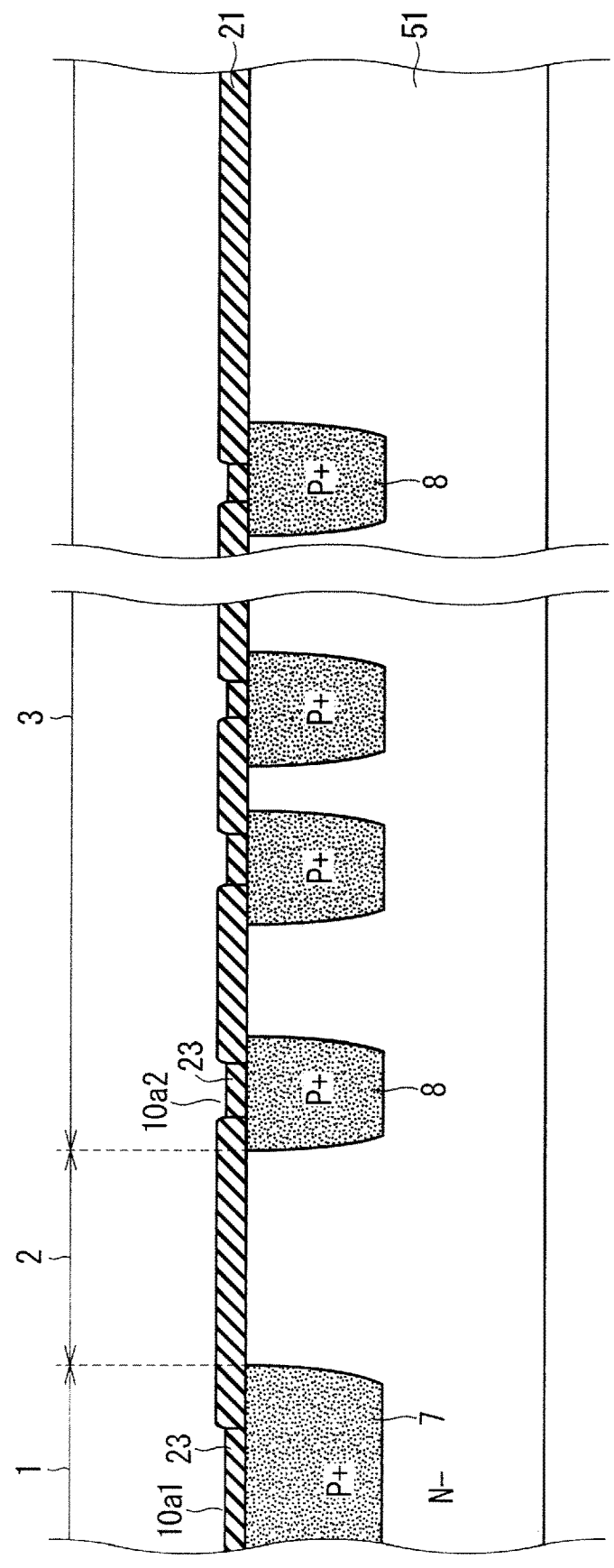
FIG. 9 is a cross-sectional diagram illustrating a manufacturing method for the related semiconductor device.

Next, as illustrated in FIG. 9, the injected impurities 22 are activated. In this manner, the anode layer 7 is formed below the first opening portion 10a1, and the guard ring layers 8 are formed below the first opening portions 10a2. Note that, due to the temperature during this activation, bottom portions of the first opening portions 10a1 and 10a2 are oxidized, and an insulation film 23 is formed on the bottom portions.

Figure 10:
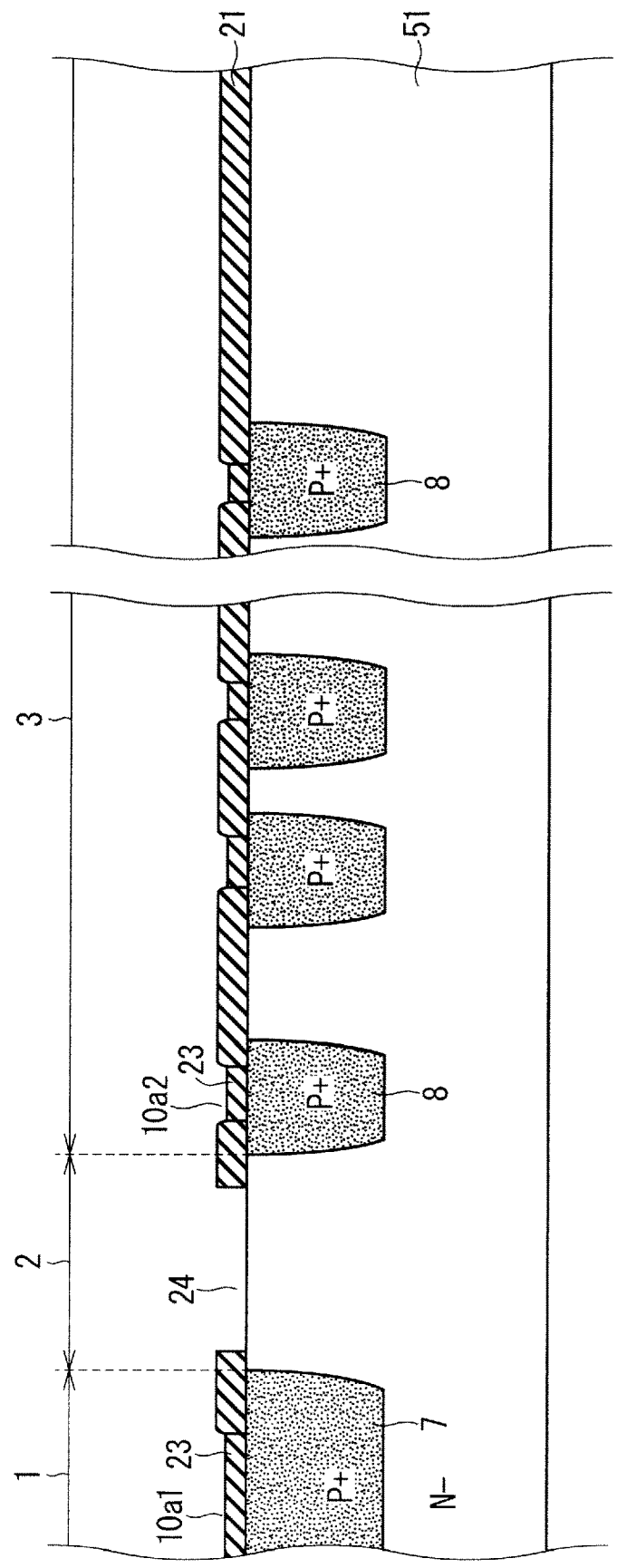
FIG. 10 is a cross-sectional diagram illustrating a manufacturing method for the related semiconductor device.

After that, as illustrated in FIG. 10, photolithography and etching are performed on the insulation film 21, thereby forming an opening portion 24 exposing the semiconductor substrate 51 in the insulation film 21 of the interface portion 2. Then, as illustrated in FIG. 11, P-type impurities 25 are injected into the semiconductor substrate 51 with concentration lower than the injection concentration of FIG. 8, through the opening portion 24.

Figure 12:
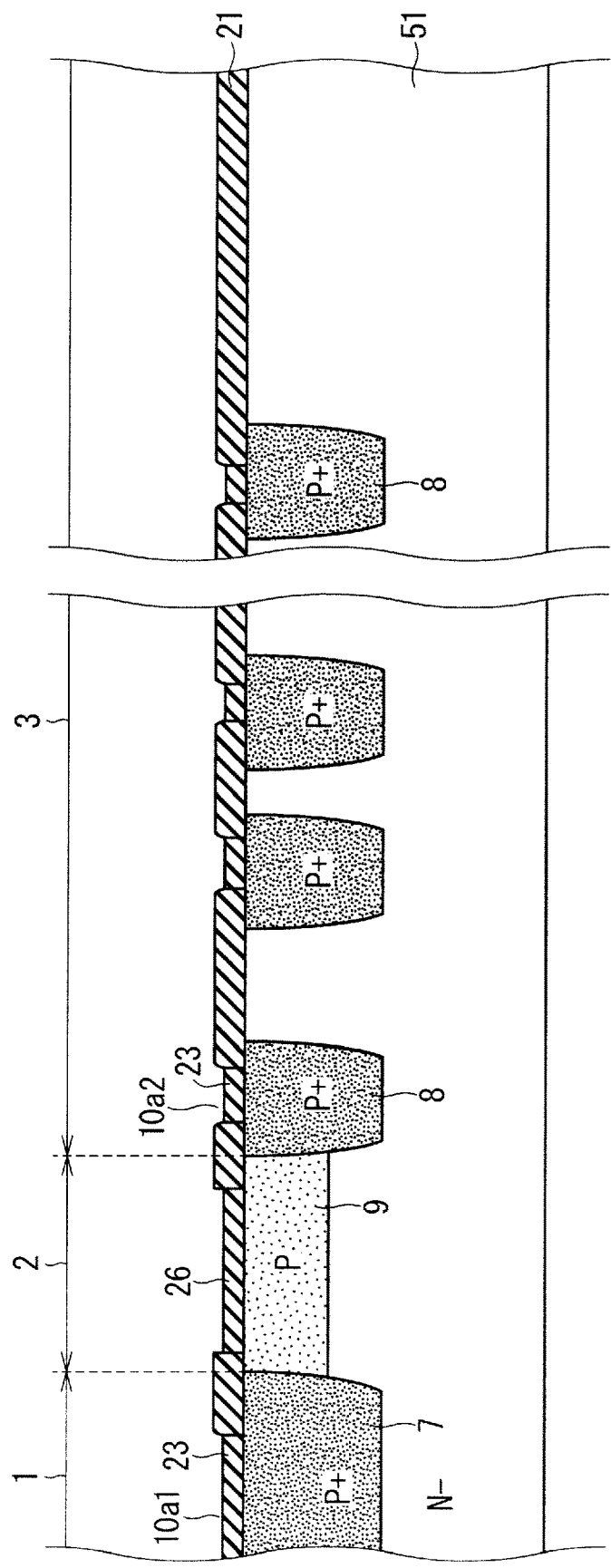
FIG. 12 is a cross-sectional diagram illustrating a manufacturing method for the related semiconductor device.

Next, as illustrated in FIG. 12, the injected impurities 25 are activated. In this manner, the ballast resistance layer 9 is formed below the opening portion 24. Note that, due to the temperature during this activation, a bottom portion of the opening portion 24 is oxidized, and an insulation film 26 is formed on the bottom portion.

Figure 13:
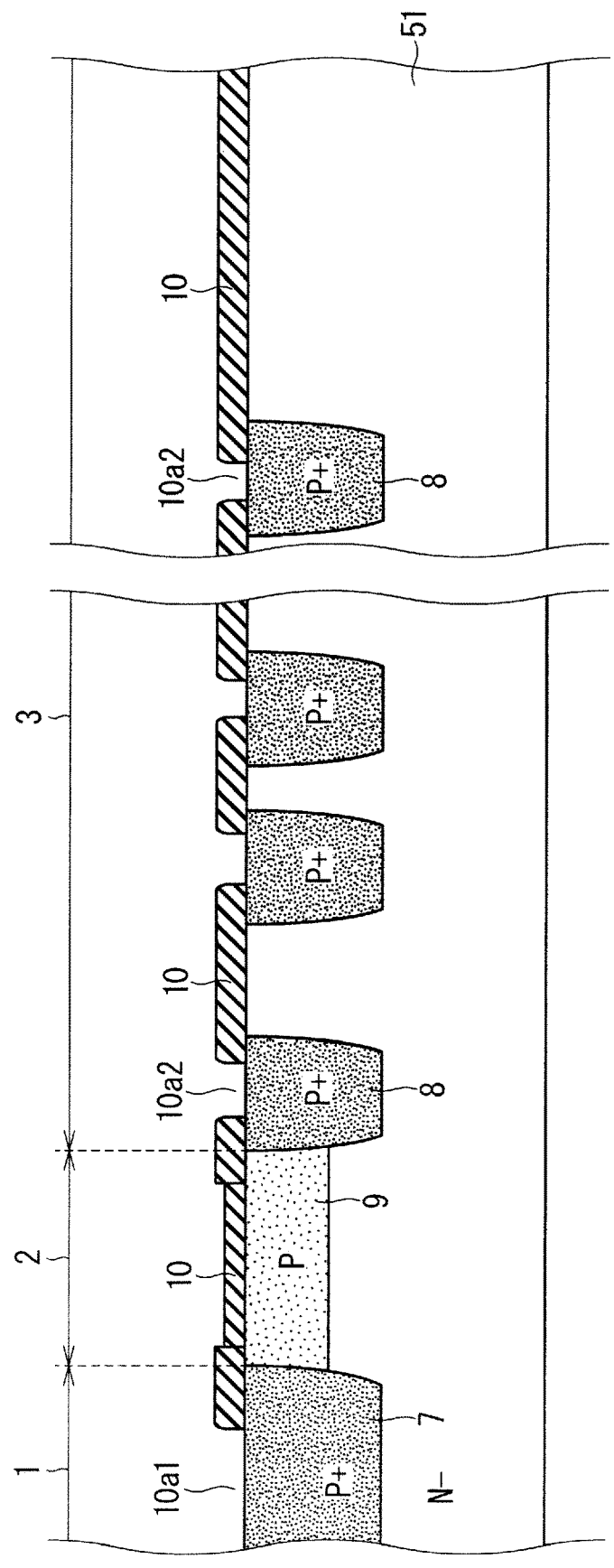
FIG. 13 is a cross-sectional diagram illustrating a manufacturing method for the related semiconductor device.
Figure 14:
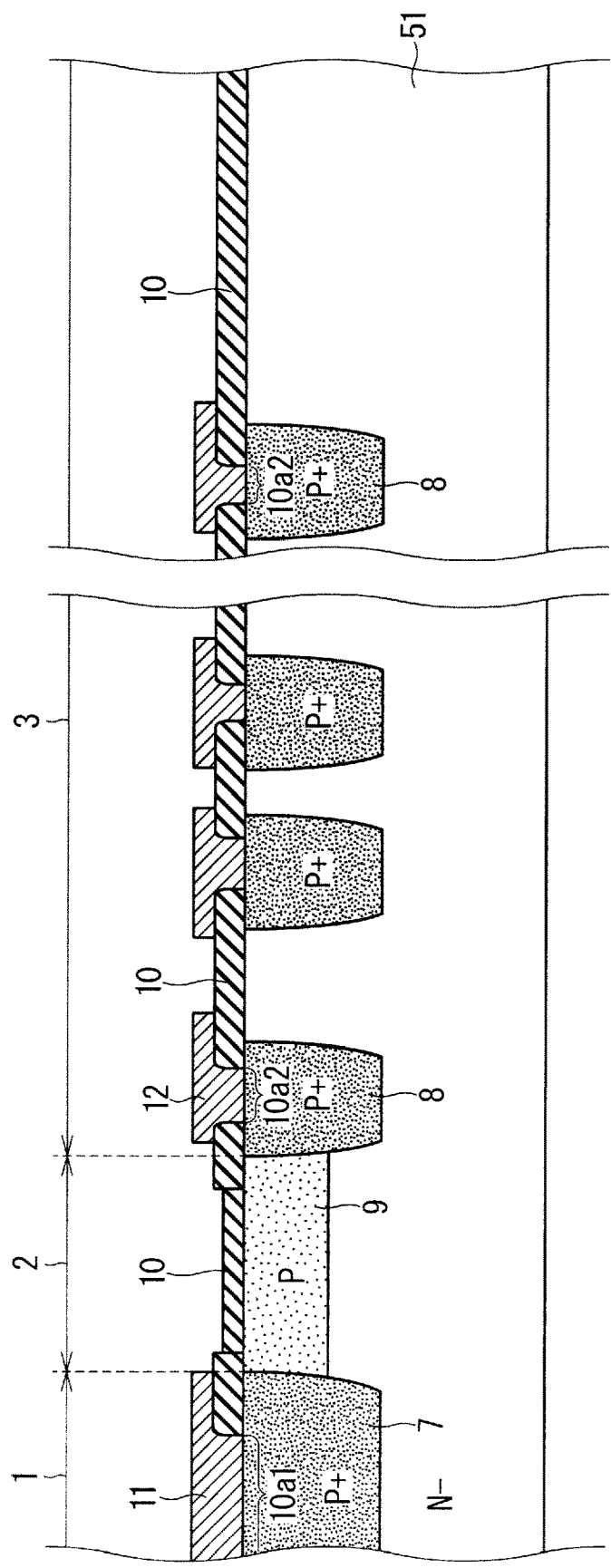
FIG. 14 is a cross-sectional diagram illustrating a manufacturing method for the related semiconductor device.
Figure 15:
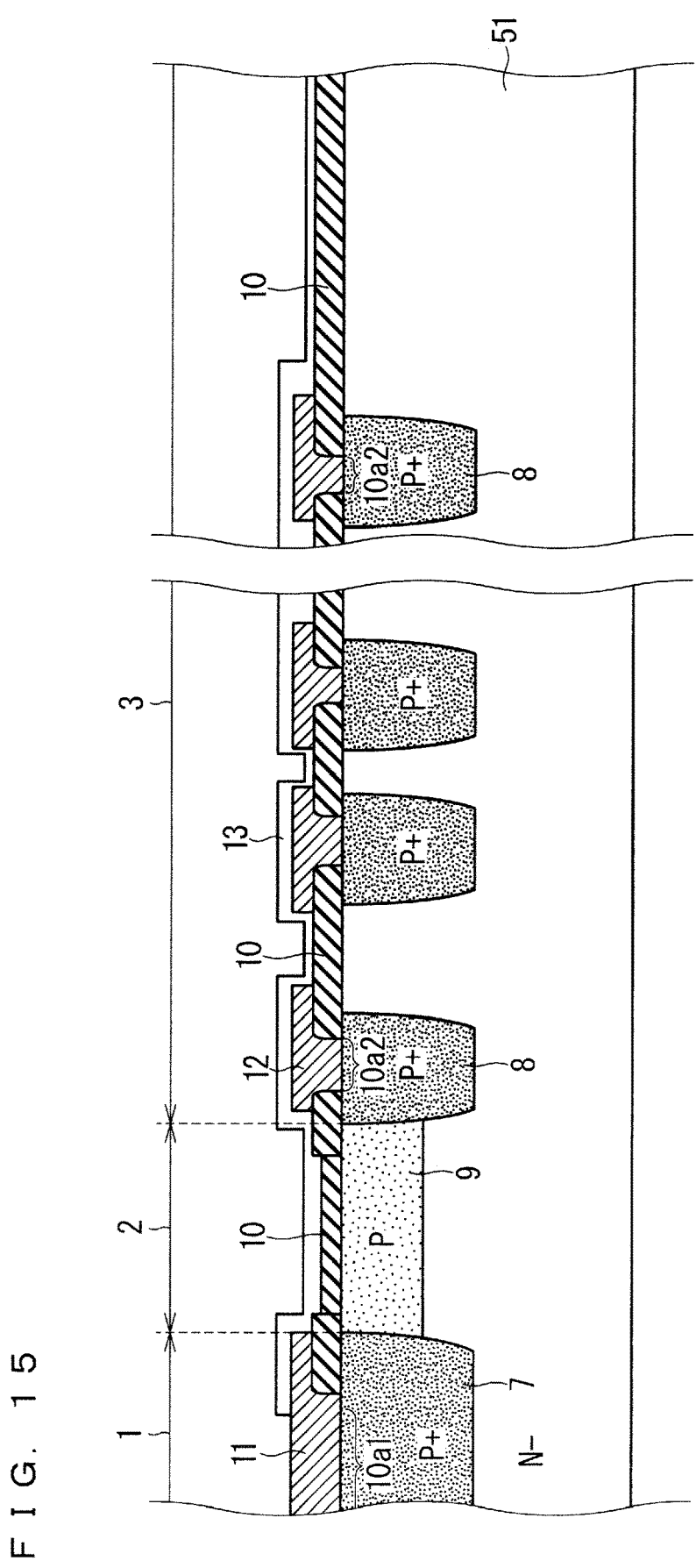
FIG. 15 is a cross-sectional diagram illustrating a manufacturing method for the related semiconductor device.

Then, as illustrated in FIG. 13, the insulation film 23 on the bottom portions of the first opening portions 10a1 and 10a2 is removed, by using a mask used in the process of FIG. 7. In this manner, the insulation film 10 of FIG. 2 is formed. Then, as illustrated in FIG. 14, the front surface electrode 11 and the termination conductive film 12 are selectively formed on the anode layer 7 and the guard ring layers 8, respectively, and as illustrated in FIG. 15, the semi-insulation film 13 is selectively formed. Then, the buffer layer 14, the N+ layer 15, and the back surface electrode 16 are formed on the back surface of the semiconductor substrate 51. Consequently, the related semiconductor device of FIG. 2 is completed.

Figure 11:
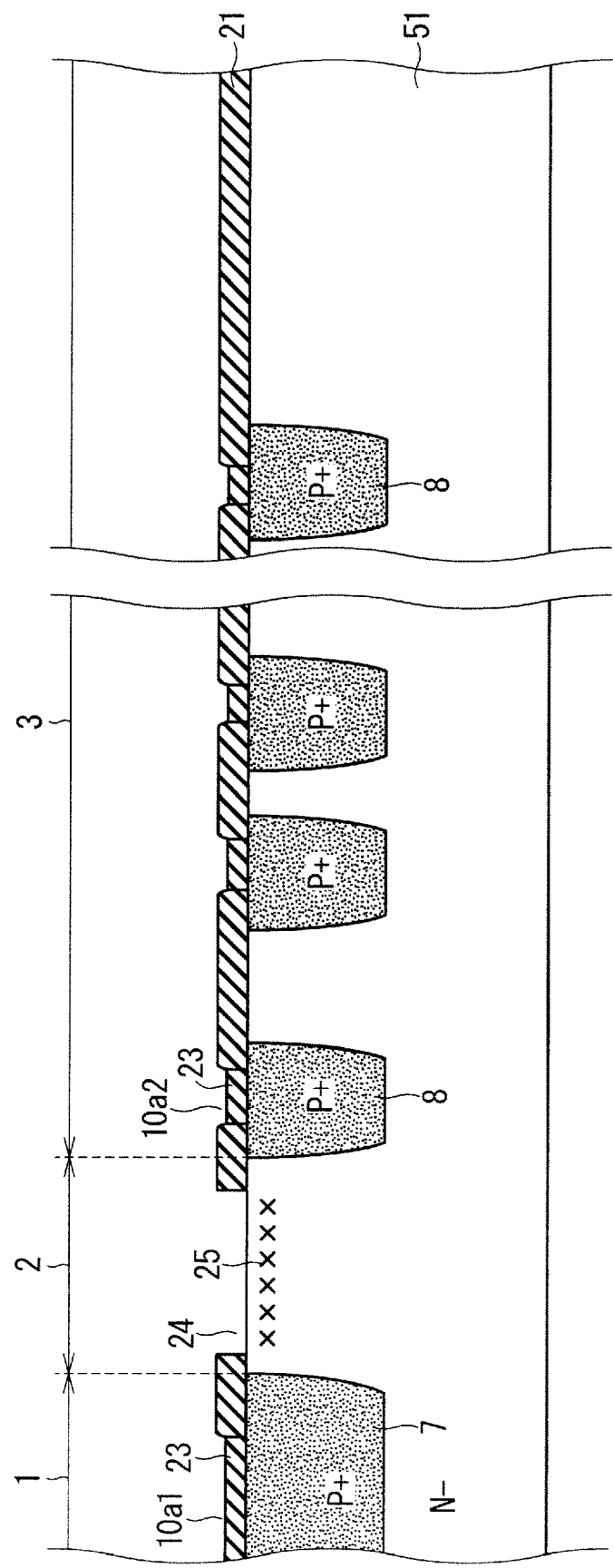
FIG. 11 is a cross-sectional diagram illustrating a manufacturing method for the related semiconductor device.

Incidentally, to form the ballast resistance layer 9 in the manufacturing process of the related semiconductor device, a dedicated mask used in FIG. 10, and dedicated processes used in the injection process of the impurities 25 of FIG. 11 and the activation process of FIG. 12 are required. As a result, a problem of causing increase in manufacturing costs is present. In light of this, in the embodiments of the present invention described below, this problem can be solved.

First Embodiment

Figure 16:
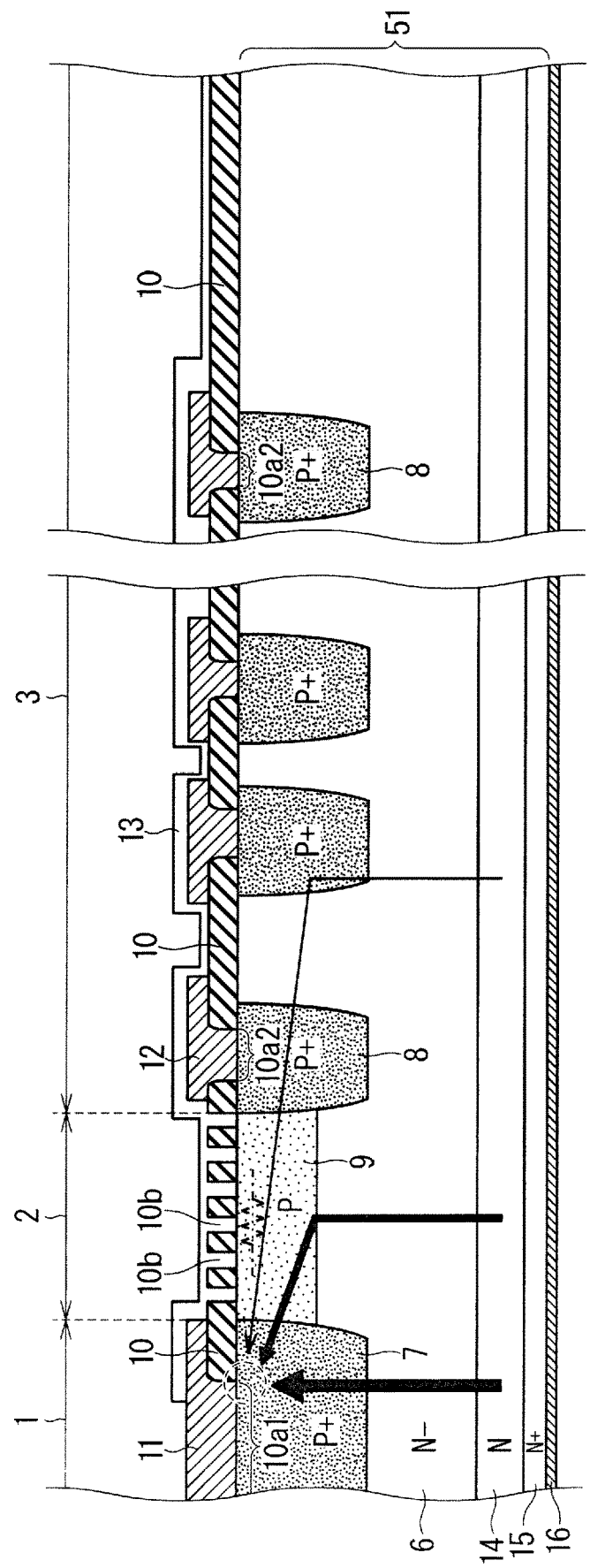
FIG. 16 is a cross-sectional diagram illustrating a configuration of a semiconductor device according to a first embodiment.

FIG. 16 is a cross-sectional diagram illustrating a configuration of a semiconductor device according to a first embodiment of the present invention. The cross-sectional diagram of FIG. 16 corresponds to the cross-sectional diagram of FIG. 2. In the following, of components according to the first embodiment, components that are the same as or similar to the components described above are denoted by the same or similar reference signs, and different components will be mainly described.

As illustrated in FIG. 16, the insulation film 10 according to the first embodiment not only includes the first opening portions 10a1 and 10a2, but also includes a plurality of second opening portions 10b in the interface portion 2, each of which has an opening ratio lower than each of the first opening portions 10a1 and 10a2. Here, the opening ratio refers to a ratio of an opening portion (the first opening portion or the second opening portion) per unit area, and is a value obtained by dividing the total area of an opening portion by the total area of the insulation film 10 and the opening portion.

FIG. 17 is a plan view illustrating the first opening portion 10a1 and the second opening portions 10b. Note that the first opening portion 10a2 is substantially the same as the first opening portion 10a1, and hereinafter the same holds true. In the example of FIG. 17, the first opening portion 10a1 does not particularly have a pattern, whereas the second opening portions 10b have a stripe pattern. As a result, each of the plurality of second opening portions 10b has an opening ratio lower than each of the first opening portions 10a1 and 10a2.

The ballast resistance layer 9 according to the first embodiment is a P-type second impurity layer having impurity concentration lower than that of the anode layer 7 and the guard ring layers 8, as with the ballast resistance layer 9 of the related semiconductor device. In the first embodiment, concentration of the anode layer 7 on a surface of the semiconductor substrate 51 is $10^{16}$ to $10^{18}$ cm$^3$, and concentration of the ballast resistance layer 9 on a surface of the semiconductor substrate 51 is $10^{14}$ to $10^{16}$ cm$^{-3}$. Note that it is preferable that the concentration of the ballast resistance layer 9 on a surface of the semiconductor substrate 51 be 0.001 times higher than and 0.5 times lower than the concentration of the anode layer 7 on a surface of the semiconductor substrate 51.

Further, as illustrated in FIG. 16, the ballast resistance layer 9 according to the first embodiment is disposed in a surface of the semiconductor substrate 51 throughout positions below each of the plurality of second opening portions 10b. Further, the semi-insulation film 13 is connected to the front surface electrode 11 and the termination conductive film 12, and is connected to the ballast resistance layer 9 through the second opening portions 10b.

<Manufacturing Method>

Next, a manufacturing method for the semiconductor device according to the first embodiment will be described. FIG. 18 to FIG. 22 are each a cross-sectional diagram illustrating a manufacturing method for the semiconductor device according to the first embodiment.

Figure 18:
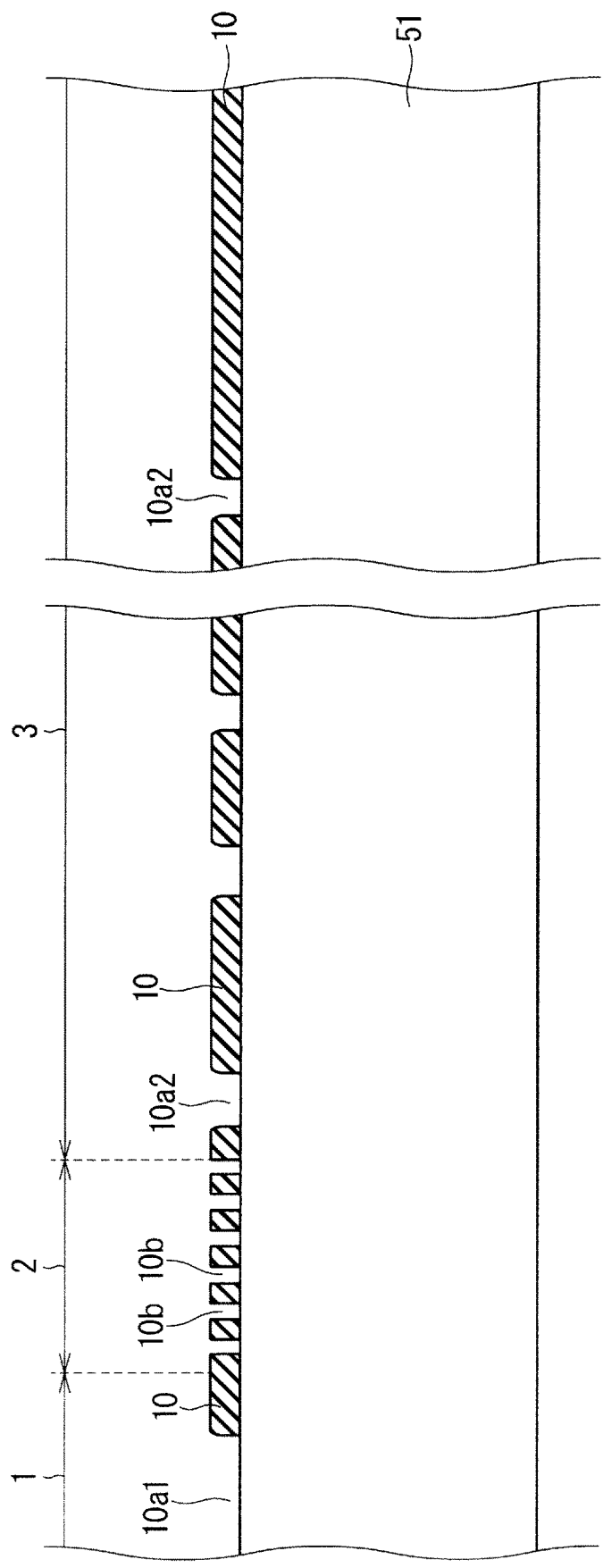
FIG. 18 is a cross-sectional diagram illustrating a manufacturing method for the semiconductor device according to the first embodiment.

First, as with the case of the related semiconductor device, the semiconductor substrate 51 is prepared (FIG. 5), and the insulation film 21 is formed on a surface of the semiconductor substrate 51 (FIG. 6). Then, as illustrated in FIG. 18, photolithography and etching are performed, thereby forming the first opening portions 10a1 and 10a2 exposing the semiconductor substrate 51 in the insulation film 21 of the cell portion 1 and the termination portion 3, and forming the second opening portions 10b exposing the semiconductor substrate 51 in the insulation film 21 of the interface portion 2. In this manner, the insulation film 10 of FIG. 16 is substantially formed.

Figure 19:
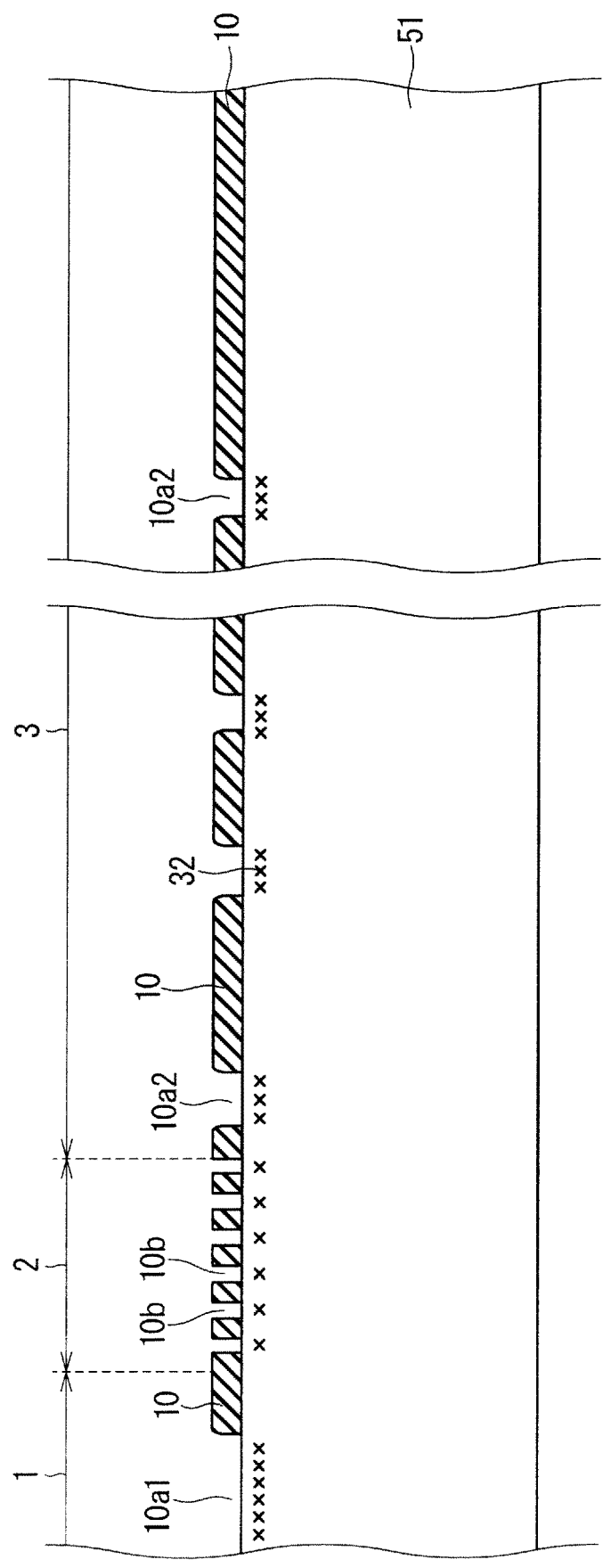
FIG. 19 is a cross-sectional diagram illustrating a manufacturing method for the semiconductor device according to the first embodiment.

Next, as illustrated in FIG. 19, P-type impurities 32 are injected into the semiconductor substrate 51 with relatively high concentration, through the first opening portions 10a1 and 10a2. Note that since the second opening portions 10b have an opening ratio lower than that of the first opening portions 10a1 and 10a2, the impurities 32 less easily reach the semiconductor substrate below the second opening portions 10b. Therefore, when an injection device uniformly applies the P-type impurities 32, the P-type impurities 32 are injected into the semiconductor substrate 51 below the first opening portions 10a1 and 10a2 with relatively high concentration, whereas the P-type impurities 32 are injected into the semiconductor substrate 51 below the second opening portions 10b with concentration lower than the above concentration.

Figure 20:
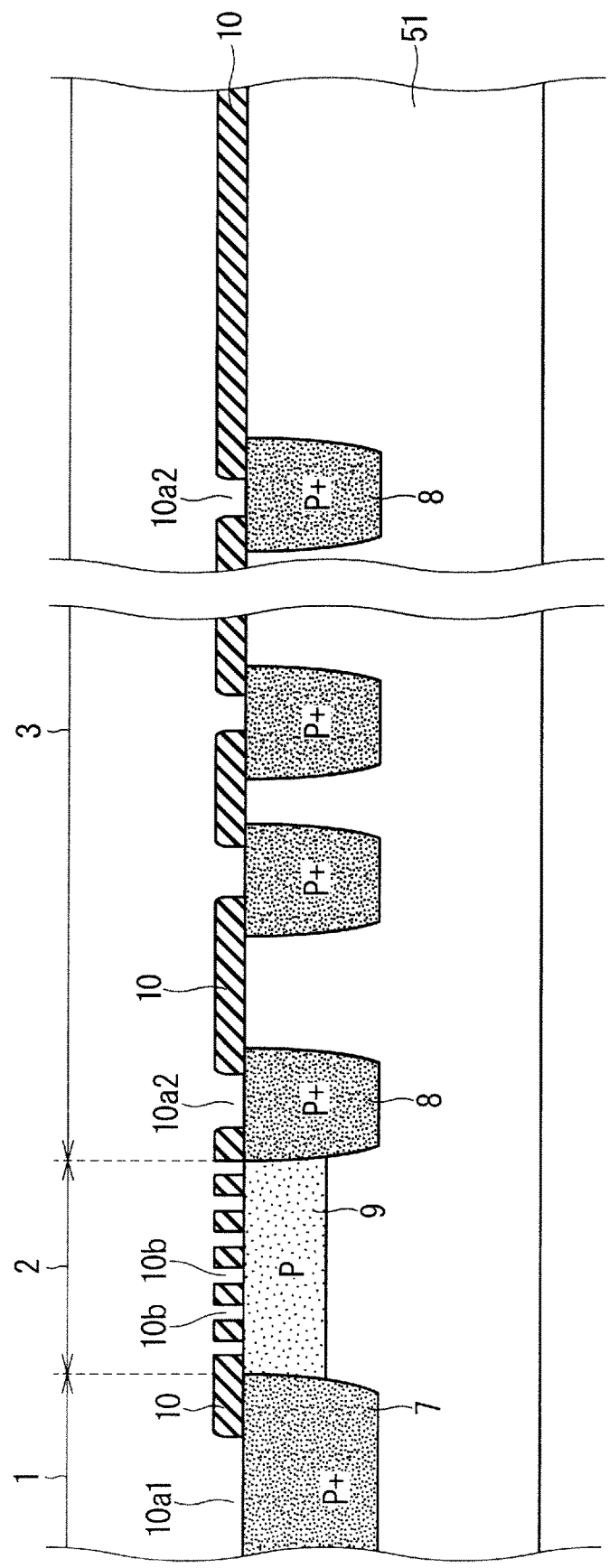
FIG. 20 is a cross-sectional diagram illustrating a manufacturing method for the semiconductor device according to the first embodiment.

Then, as illustrated in FIG. 20, the injected impurities 32 are activated. In this manner, the anode layer 7 is formed below the first opening portion 10a1, the guard ring layers 8 are formed below the first opening portions 10a2, and the ballast resistance layer 9 is formed below the second opening portions 10b. Note that an insulation film (not shown) formed on bottom portions of the first opening portions 10a1 and 10a2 and the second opening portions 10b due to the temperature during the activation is removed, by using a mask used in the process of FIG. 18.

Figure 21:
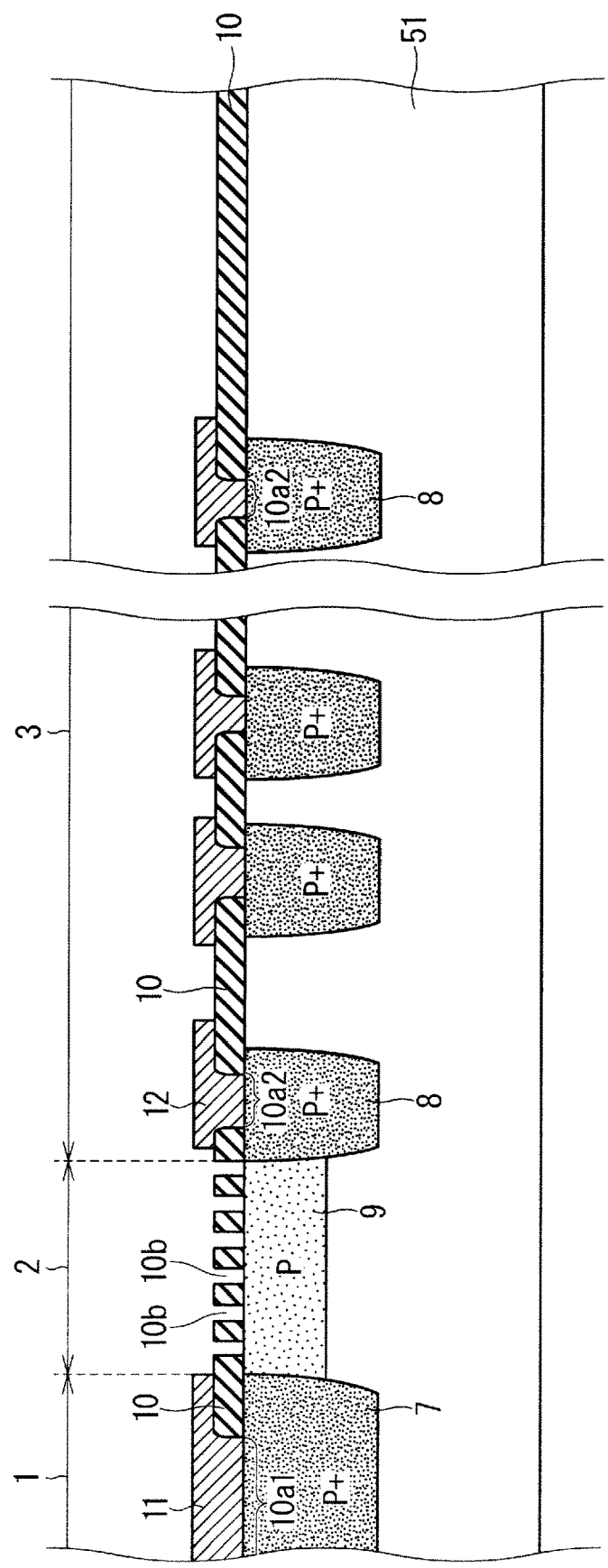
FIG. 21 is a cross-sectional diagram illustrating a manufacturing method for the semiconductor device according to the first embodiment.
Figure 22:
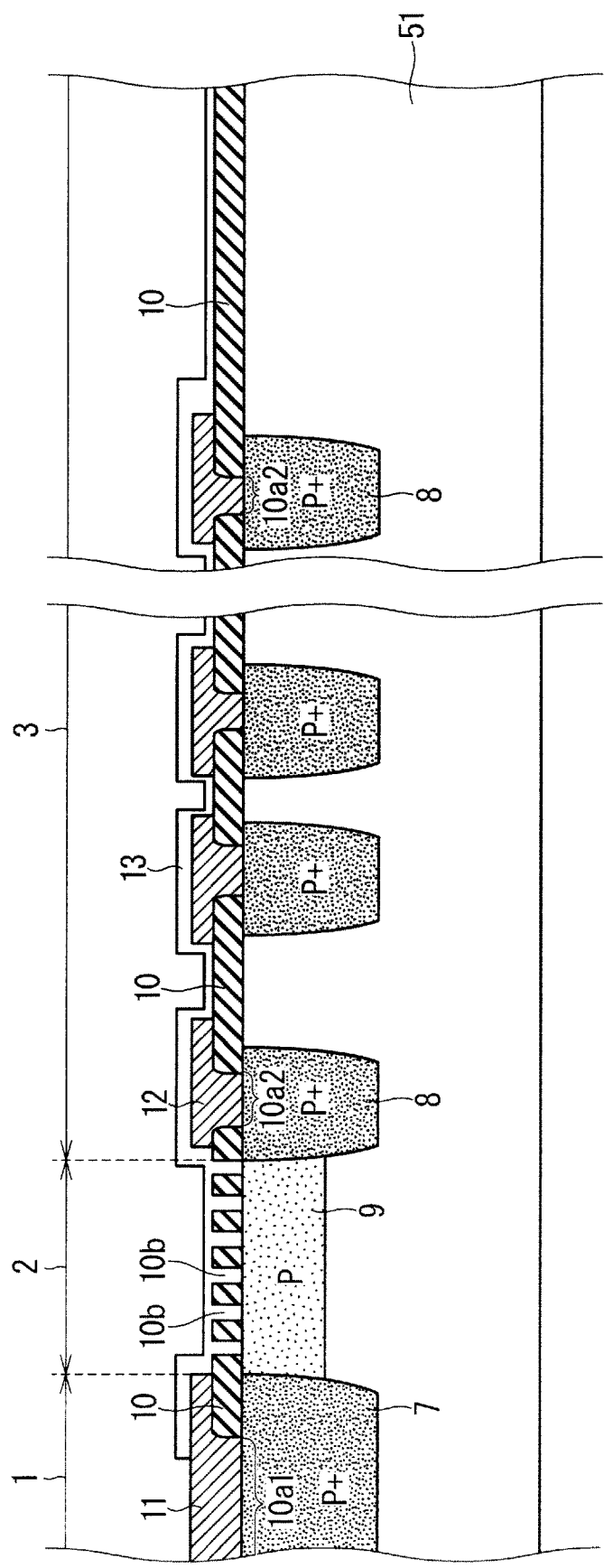
FIG. 22 is a cross-sectional diagram illustrating a manufacturing method for the semiconductor device according to the first embodiment.

Next, as illustrated in FIG. 21, the front surface electrode 11 and the termination conductive film 12 are selectively formed on the anode layer 7 and the guard ring layers 8, respectively, and as illustrated in FIG. 22, the semi-insulation film 13 is selectively formed. Then, the buffer layer 14, the N+ layer 15, and the back surface electrode 16 are formed on the back surface of the semiconductor substrate 51. Consequently, the semiconductor device of FIG. 16 is completed.

Overview of First Embodiment

According to the semiconductor device according to the first embodiment as described above, dedicated mask and processes for forming the ballast resistance layer 9, which are required in the manufacture of the related semiconductor device, are not required. Therefore, manufacturing costs of the semiconductor device can be reduced.

Note that, in the configuration in which the semiconductor substrate 51 (ballast resistance layer 9) in the second opening portions 10b is exposed, contaminants may enter the semiconductor substrate 51, and characteristics of the device may be deteriorated. Further, due to the influence of external electric charge in an application environment, the surface of the semiconductor substrate 51 may be charged up through an oxide film, and long-term reliability of the semiconductor device may be deteriorated.

In light of this, in the first embodiment, the second opening portions 10b are covered by the semi-insulation film 13. Therefore, deterioration in characteristics of the device due to contaminants can be less liable to be caused. Further, the semi-insulation film 13 has characteristics of hopping conduction of electric charge, and therefore electric charge induced by external influence flows due to the hopping conduction. As a result, local potential distribution abnormality due to external influence can be less liable to be caused, and thus long-term reliability can be enhanced.

<First Modification>

Figure 23:
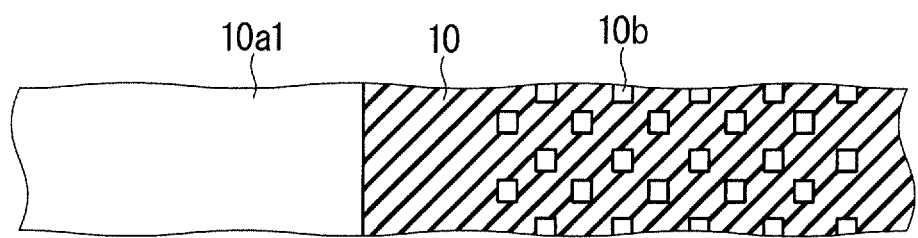
FIG. 23 is a plan view illustrating a configuration of a first opening portion and second opening portions according to a first modification.
Figure 24:
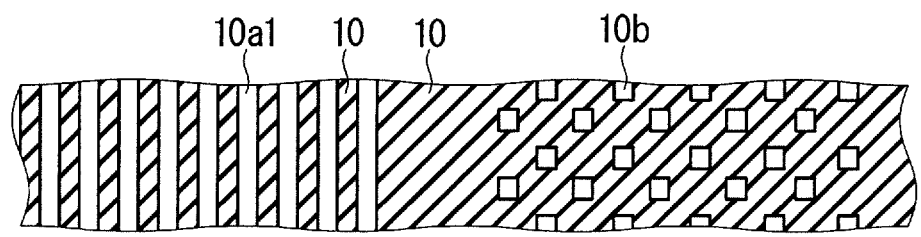
FIG. 24 is a plan view illustrating a configuration of first opening portions and second opening portions according to the first modification.

In the first embodiment, an example of the first opening portion 10a1 and the second opening portions 10b is illustrated in FIG. 17. However, the shapes of the second opening portions 10b and the first opening portions 10a1 and 10a2 are not limited to those illustrated in FIG. 17, as long as the opening ratio of the second opening portions 10b is lower than the opening ratio of each of the first opening portions 10a1 and 10a2. For example, as illustrated in FIG. 23, the first opening portion 10a1 may not particularly have a pattern, whereas the second opening portions 10b may have a dotted pattern. Further, for example, as illustrated in FIG. 24, first opening portions 10a1 may have a stripe pattern, and the second opening portions 10b may have a dotted pattern.

Further, although illustration is omitted, first opening portions 10a1 may have a stripe pattern, and the second opening portions 10b may have a stripe pattern having a different size from the stripe pattern of the first opening portions 10a1. Alternatively, first opening portions 10a1 may have a honeycomb pattern, and the second opening portions 10b may have a honeycomb pattern having a different size and density from the honeycomb pattern of the first opening portions 10a1. Note that, in the examples of the FIG. 17, FIG. 23, and FIG. 24, each of the first opening portions 10a1 and the second opening portions 10b are uniformly disposed in the insulation film 10, but may be locally non-uniform.

As described above, by controlling the opening ratio of the second opening portions 10b, impurity concentration of the ballast resistance layer 9 can be controlled, and thus recovery interruption capability can be controlled. In this manner, a semiconductor device having appropriate recovery interruption capability can be implemented. Note that the above first modification can also be similarly applied to various configurations other than the first embodiment.

<Second Modification>

Figure 25:
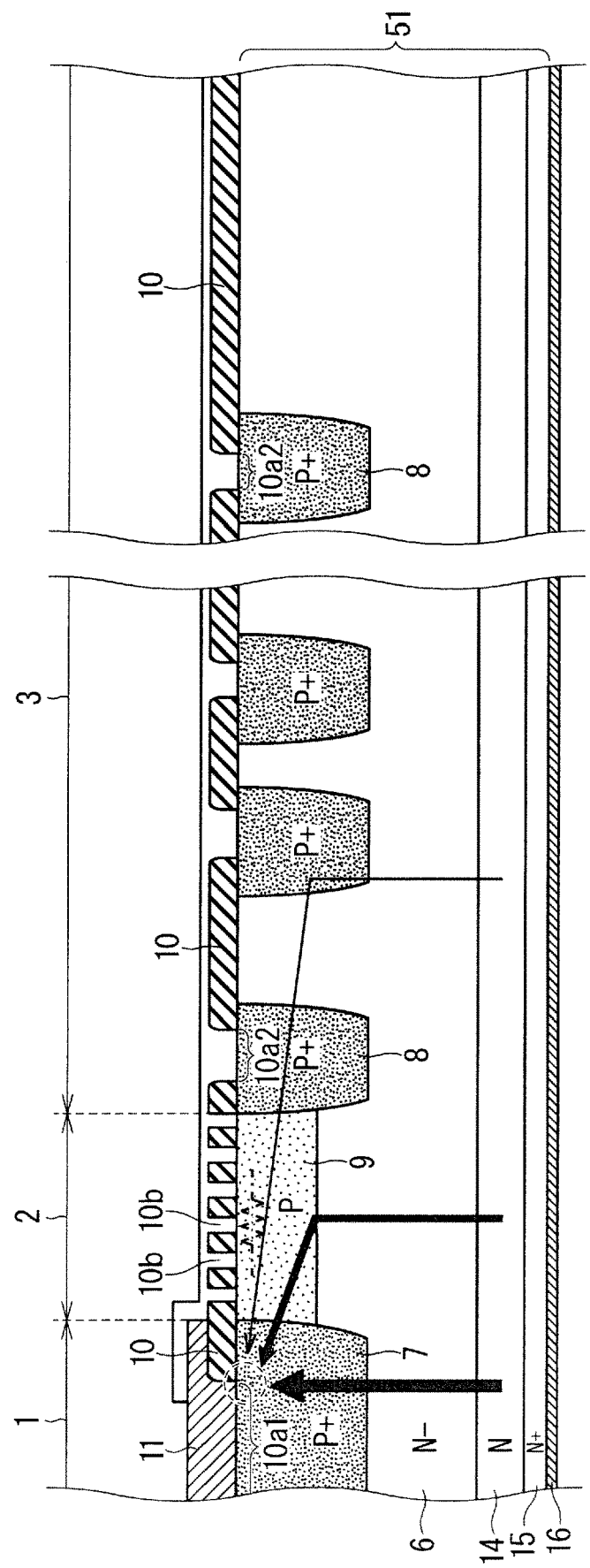
FIG. 25 is a cross-sectional diagram illustrating a configuration of a semiconductor device according to a second modification.

The semiconductor device according the first embodiment includes the termination conductive film 12 (FIG. 16). However, as illustrated in FIG. 25, the semiconductor device may not include the termination conductive film 12. In this case, the semi-insulation film 13 is connected to the front surface electrode 11, and is connected to each of the guard ring layers 8 and the ballast resistance layer 9 through the first opening portions 10a2 and the second opening portions 10b. Also with such a configuration, effects similar to those of the first embodiment can be obtained. Note that the above second modification can also be similarly applied to various configurations other than the first embodiment.

Second Embodiment

Figure 26:
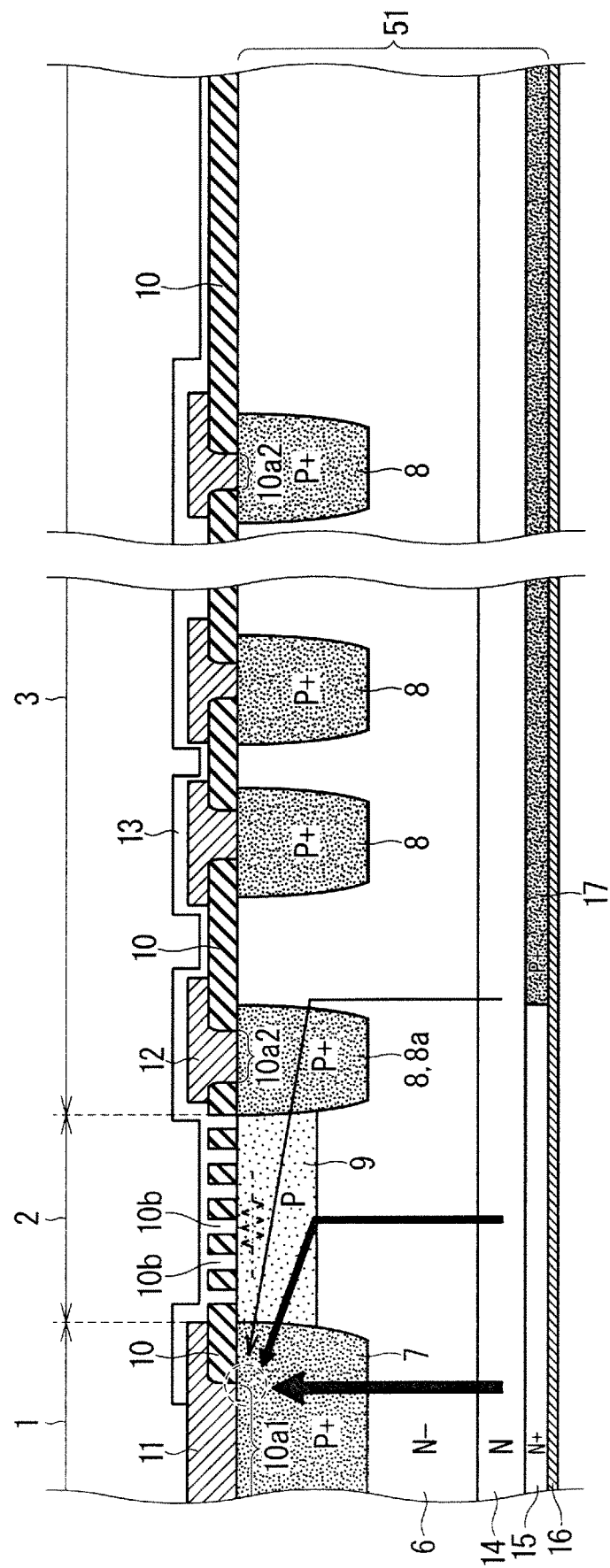
FIG. 26 is a cross-sectional diagram illustrating a configuration of a semiconductor device according to a second embodiment.

FIG. 26 is a cross-sectional diagram illustrating a configuration of a semiconductor device according to a second embodiment of the present invention. The cross-sectional diagram of FIG. 26 corresponds to the cross-sectional diagram of FIG. 16. In the following, of components according to the second embodiment, components that are the same as or similar to the components described above are denoted by the same or similar reference signs, and different components will be mainly described.

As illustrated in FIG. 26, the semiconductor device according to the second embodiment has a configuration that a P+ layer 17 is added to the configuration (FIG. 16) of the semiconductor device according to the first embodiment.

The N+ layer 15 is an N+-type third impurity layer having impurity concentration higher than that of the semiconductor substrate 51. In the second embodiment, the N+ layer 15 is disposed on the back surface of the semiconductor substrate 51, at the interface portion 2, the cell portion 1 and a corresponding portion which is a portion of the termination portion 3 corresponding to one guard ring layer 8a closest to the interface portion 2.

The P+ layer 17 is a P+-type fourth impurity layer. The P+ layer 17 is disposed on the back surface of the semiconductor substrate 51, at a position of the termination portion 3 except the above-mentioned corresponding portion.

According to the semiconductor device according to the second embodiment configured as described above, reduction of currents flowing from the termination portion 3 toward the anode side during recovery, i.e., recovery interruption capability, can be further enhanced.

Third Embodiment

Figure 27:
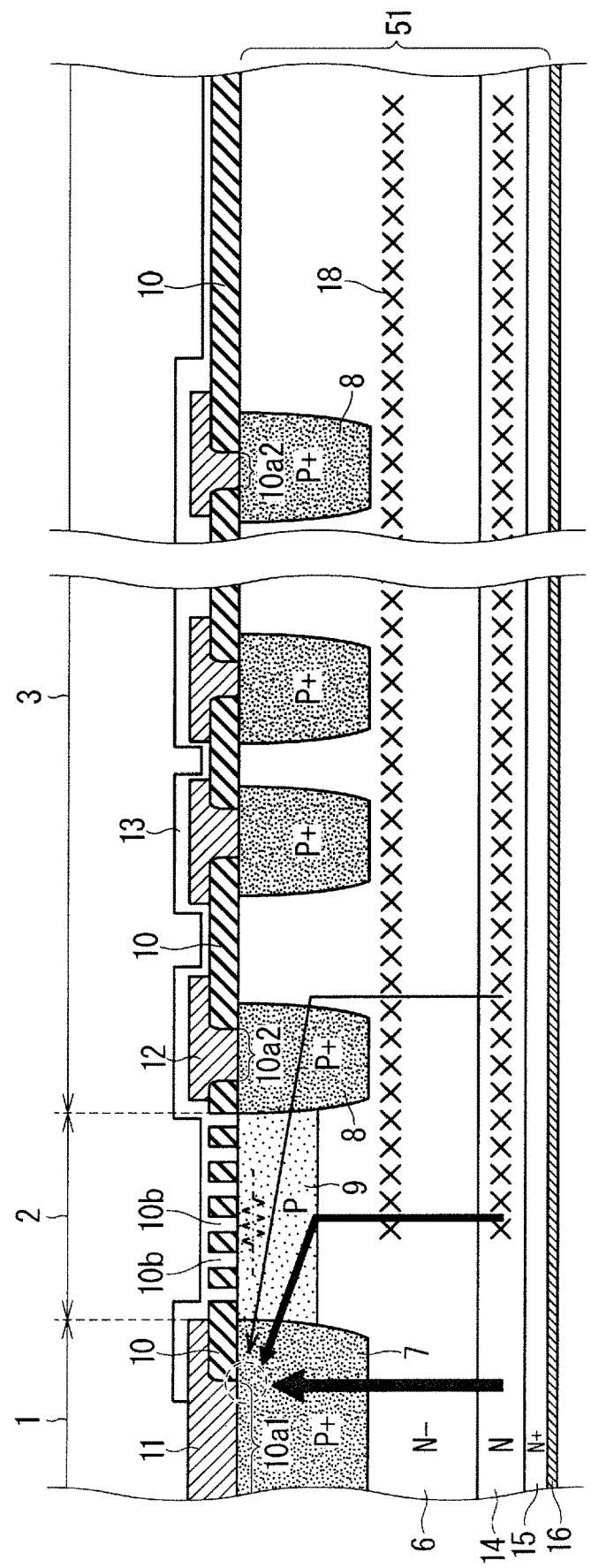
FIG. 27 is a cross-sectional diagram illustrating a configuration of a semiconductor device according to a third embodiment.

FIG. 27 is a cross-sectional diagram illustrating a configuration of a semiconductor device according to a third embodiment of the present invention. The cross-sectional diagram of FIG. 27 corresponds to the cross-sectional diagram of FIG. 16. In the following, of components according to the third embodiment, components that are the same as or similar to the components described above are denoted by the same or similar reference signs, and different components will be mainly described.

As illustrated in FIG. 27, the semiconductor device according to the third embodiment has a configuration that a lifetime killer level 18 is added to the configuration (FIG. 16) of the semiconductor device according to the first embodiment. Specifically, the semiconductor substrate 51 includes the lifetime killer level 18 in the termination portion 3. Note that, for example, the lifetime killer level 18 is formed by electron beam irradiation, proton irradiation, heavy metal diffusion, or the like.

According to the semiconductor device according to the third embodiment configured as described above, carrier concentration of the termination portion 3 can be reduced owing to the lifetime killer level 18. Therefore, reduction of currents flowing from the termination portion 3 toward the anode side during recovery, i.e., recovery interruption capability, can be further enhanced.

Note that, in the present invention, each embodiment can be freely combined with each other, and each embodiment can be modified or omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a semiconductor substrate of a first conductivity type, in which a cell region, an interface region surrounding the cell region, and a termination region surrounding the interface region are defined; and
    an insulation film disposed on a surface of the semiconductor substrate in each of the cell region, the interface region, and the termination region, wherein
    the insulation film includes a first opening portion in at least one of the cell region and the termination region, and a plurality of second opening portions in the interface region, the second opening portions having an opening ratio lower than an opening ratio of the first opening portion, and
    the semiconductor device further comprises:
        a first impurity layer of a second conductivity type disposed on the surface of the semiconductor substrate below the first opening portion;
        a second impurity layer of the second conductivity type having impurity concentration lower than impurity concentration of the first impurity layer and disposed on the surface of the semiconductor substrate below the second opening portions, and
        the second impurity layer being disposed throughout portions below each of the plurality of the second opening portions.

2. The semiconductor device according to claim 1, wherein
    the first opening portion includes an opening in the cell region and an opening in the termination region,
    the first impurity layer includes an anode layer being disposed below the opening in the cell region, and a guard ring layer being disposed below the opening in the termination region, and
    the second impurity layer includes a ballast resistance layer being disposed throughout portions below each of the plurality of the second opening portions.

3. The semiconductor device according to claim 2, wherein
    the first opening portion includes a plurality of openings in the termination region,
    the guard ring layer is one of a plurality of guard ring layers disposed below the plurality of openings in the termination region, and
    the semiconductor device further comprises:
        a third impurity layer of the first conductivity type having impurity concentration higher than impurity concentration of the semiconductor substrate and disposed on a back surface of the semiconductor substrate, at the interface region, the cell region, and a corresponding portion which is a portion of the termination region corresponding to one of the plurality of guard ring layers closest to the interface region; and
        a fourth impurity layer of the second conductivity type disposed on the back surface of the semiconductor substrate at a position of the termination region except the corresponding portion.

4. The semiconductor device according to claim 1, wherein
    concentration of the second impurity layer on the surface of the semiconductor substrate is between 0.001 and 0.5 times concentration of the first impurity layer on the surface of the semiconductor substrate.

5. The semiconductor device according to claim 1, wherein
    the semiconductor substrate includes a lifetime killer level in the termination region.

6. The semiconductor device according to claim 1, wherein
the first opening portion includes a first opening in the termination region and a third opening in the cell region, and the second opening portions each include a second opening, and
the second openings have an area lower than an area of the first opening.

7. The semiconductor device according to claim 6, wherein
the first impurity layer is a guard ring layer and the second impurity layer is a ballast resistor,
the semiconductor device further comprises an anode layer of the second conductivity type disposed on the surface of the semiconductor substrate below the third opening, and
a depth of the guard ring layer from the surface of the semiconductor substrate and a depth of the anode layer from the surface of the semiconductor substrate are each greater than a depth of the ballast resistor from the surface of the semiconductor substrate.

8. The semiconductor device according to claim 1, wherein
the first impurity layer includes a guard ring layer disposed below the opening in the termination region and an anode layer disposed in the cell region, and
a depth of the anode layer from the surface of the semiconductor substrate is equal to a depth of the guard ring layer from the surface of the semiconductor substrate and greater than a depth of the second impurity layer from the surface of the semiconductor substrate.

9. A semiconductor device comprising:
a semiconductor substrate of a first conductivity type, in which a cell region, an interface region surrounding the cell region, and a termination region surrounding the interface region are defined; and
an insulation film disposed on a surface of the semiconductor substrate, wherein
the insulation film includes a first opening portion in at least one of the cell region, and the termination region, and a second opening portion in the interface region, the second opening portion having an opening ratio lower than an opening ratio of the first opening portion,
the semiconductor device further comprises:
a first impurity layer of a second conductivity type disposed on the surface of the semiconductor substrate below the first opening portion; and
a second impurity layer of the second conductivity type having impurity concentration lower than impurity concentration of the first impurity layer and disposed on the surface of the semiconductor substrate below the second opening portion;
a conductive film disposed on the insulation film and connected to the first impurity layer through the first opening portion; and
a semi-insulation film connected to the conductive film and connected to the second impurity layer through the second opening portion.

10. The semiconductor device according to claim 9, wherein
the semi-insulation film has a hopping conductivity.

* * * * *